US008854039B2

(12) United States Patent
Carl

(10) Patent No.: US 8,854,039 B2
(45) Date of Patent: Oct. 7, 2014

(54) SYSTEM AND METHOD FOR QUANTIFYING MR DATA ACQUIRED DURING A UTE SEQUENCE

(75) Inventor: Michael Carl, Escondido, CA (US)

(73) Assignee: General Electric Company, Schenectady, NY (US)

( * ) Notice: Subject to any disclaimer, the term of this patent is extended or adjusted under 35 U.S.C. 154(b) by 699 days.

(21) Appl. No.: 13/091,710

(22) Filed: Apr. 21, 2011

(65) Prior Publication Data

US 2012/0268122 A1 Oct. 25, 2012

(51) Int. Cl.
*G01R 33/48* (2006.01)
*G01R 33/44* (2006.01)

(52) U.S. Cl.
CPC .......... *G01R 33/443* (2013.01); *G01R 33/4816* (2013.01)
USPC .......................................... 324/309; 324/307

(58) Field of Classification Search
USPC ................................. 324/307–309
See application file for complete search history.

(56) References Cited

U.S. PATENT DOCUMENTS

2007/0080685 A1* 4/2007 Bydder et al. ................ 324/309
2010/0231218 A1* 9/2010 Qian et al. .................... 324/309

OTHER PUBLICATIONS

Bergin et al., "Lung Parenchyma: Projection Reconstruction MR Imaging," Radiology 1991, vol. 179, No. 3, pp. 777-781.
Bernstein et al., "Handbook of MRI Pulse Sequences," Elsevier Academic Press, London, 2004, p. 874.
Brittain et al., "Ultra-Short TE Imaging with Single-Digit (8us) TE," Proceedings of the 12th Annual Meeting of ISMRM, Kyoto, Japan, 2004, p. 629.
E. Mark Haacke, Jurgen R. Reichenbach, Jiang Du, Michael Carl, and Graeme M. Bydder, "Susceptibility Weighted Imaging in MRI: Basic Concepts and Clinical Applications," Wiley-Blackwell, 2011, Chapter 36, "Ultrashort TE Imaging: Phase and Frequency Mapping of Susceptibility Effects in Short T2 Tissues of the Musculoskeletal System," pp. 669-696.
De Graaf et al., "In Vivo NMR Spectroscopy," Principles and Techniques, Wiley, 2nd Edition, p. 235.
Gatehouse et al., "Magnetic Resonance Imaging of Short T2 Components in Tissue," Clinical Radiology, 2003, vol. 58, pp. 1-19.
Haacke et al., "Susceptibility Weighted Imaging (SWI)," Magnetic Resonance in Medicine, 2004, vol. 52, pp. 612-618.
Hargreaves et al., "Variable-Rate Selective Excitation for Rapid MRI Sequences," Magnetic Resonance in Medicine, 2004, vol. 52, pp. 590-597.

(Continued)

*Primary Examiner* — Melissa Koval
*Assistant Examiner* — Rishi Patel
(74) *Attorney, Agent, or Firm* — Ziolkowski Patent Solutions Group, SC

(57) ABSTRACT

A system and method for quantifying MR data acquired during a UTE sequence include a computer programmed to execute an MR scan comprising an application of an RF pulse, an echo time (TE) period, and an application of a data acquisition gradient pulse, wherein the TE period begins after the RF pulse and ends before the data acquisition gradient pulse. MR data of an imaging object are acquired during application of the data acquisition gradient pulse, and a phase image is reconstructed based on the acquired MR data. The computer is also programmed to calculate a first contribution of phase to the phase image during the application of the RF pulse, to calculate a second contribution of phase to the phase image by the application of the data acquisition gradient pulse, and to generate a frequency map based on the phase image and based on the first and second contributions of phase.

20 Claims, 3 Drawing Sheets

(56) References Cited

OTHER PUBLICATIONS

Krasnosselskaia et al., "Water in Tendon: Orientational Analysis of the Free Induction Decay," Magnetic Resonance in Medicine, 2005, vol. 54, pp. 280-288.

Li et al., "Magnetic Susceptibility Quantitation with MRI by Solving Boundary Value Problems," Medical Physics, Mar. 2003, vol. 30, No. 3, pp. 449-453.

Petersen et al., "Collagenous fibril texture of the human knee joint menisci," Anat Embryol, 1998; vol. 197, pp. 317-324.

Chiang et al., "Phase accrual during excitation in ultrashort TE (UTE) imaging: an alternate definition of TE for phase measurements," Proceedings of the 17th Annual Meeting of ISMRM, 2004, Honolulu, Hawaii, p. 3759.

Rahmer et al., "Three-Dimensional Radial Ultrashort Echo-Time Imaging with T2 Adapted Sampling," Magnetic Resonance in Medicine, 2006, vol. 55, pp. 1075-1082.

Rauscher et al., "Magnetic Susceptibility-Weighted MR Phase Imaging of the Human Brain," AJNR Am J Neuroradiol, Apr. 2005, vol. 26, pp. 736-742.

Reichenbach et al., "Theory and Application of Static Field Inhomogeneity Effects in Gradient-Echo Imaging," JMRI, 1997, vol. 7, No. 2, pp. 266-279.

Robson et al., "Magnetic Resonance: An Introduction to Ultrashort TE (UTE) Imaging," J Comput Assist Tomogr, Nov./Dec. 2003, vol. 27, No. 6, pp. 825-846.

Scheidegger et al., "FID-Acquired-Echos (FAcE): A Short Echo Time Imaging Method for Flow Artefact Suppression," Magnetic Resonance Imaging, 1991, vol. 9, pp. 517-524.

\* cited by examiner

SYSTEM AND METHOD FOR QUANTIFYING MR DATA ACQUIRED DURING A UTE SEQUENCE

BACKGROUND OF THE INVENTION

Embodiments of the invention relate generally to ultrashort TE (UTE) MR imaging and, more particularly, to a system and method of calculating a phase image frequency map based on image data acquired during execution of a UTE MR scan.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals is digitized and processed to reconstruct the image using one of many well known reconstruction techniques.

Ultrashort echo time (UTE) MRI utilizes specialized pulse sequences with nominal TEs as low as a few microseconds to detect signals from the short T2 tissues frequently encountered in the musculoskeletal system. FIG. 1 illustrates an exemplary gradient recalled echo (GRE) sequence. As illustrated, the TE field 2 is defined as the time starting at the center of the RF pulse 4 and ending at the center of the data acquisition (DAQ) window 6 where k=0. In contrast, FIG. 2 illustrates an exemplary pulse sequence diagram of a UTE pulse sequence. As shown, a nominal TE field 8 is defined as the time from the end of the RF pulse 10 to the beginning of data acquisition 12 where k=0.

Using UTE sequences, it is possible to directly visualize short $T_2$ tissues such as tendons ($T_2 \approx 2$ ms), ligaments ($T_2 \approx 4$-10 ms), menisci ($T_2 \approx 4$-10 ms), and cortical bone ($T_2 \approx 0.5$ ms). This is usually achieved by acquiring the Free Induction Decay (FID) of the MR signal as soon after the end of the RF excitation pulse as possible, and is frequently accomplished with a radial center-out k-space trajectory and data sampling of a few hundred microseconds. Magnitude images may be reconstructed from the (re-gridded) k-space data.

Susceptibility weighting is sometimes used as a source of contrast in studies of the brain and body employing gradient echo sequences with typical TEs of 10-40 ms to allow time for phase difference to evolve. In studies of short $T_2$ tissues, much shorter TEs are used to detect signals. Accordingly, the time available to develop significant phase differences is more limited for UTE imaging. High phase contrast may be found, however, in phase images reconstructed from data acquired during a UTE sequence.

It would therefore be desirable to have a system and method capable of generating a frequency map based on a phase image reconstructed from data acquired during a UTE sequence.

BRIEF DESCRIPTION OF THE INVENTION

In accordance with one aspect of the invention, an MR imaging apparatus includes apparatus includes a magnetic resonance imaging (MRI) system having a plurality of gradient coils positioned about a bore of a magnet, and an RF transceiver system and an RF switch controlled by a pulse module to transmit RF signals to an RF coil assembly to acquire MR images. The MRI apparatus also includes a computer programmed to execute an MR scan comprising an application of an RF pulse, an echo time (TE) period, and an application of a data acquisition gradient pulse, wherein the TE period begins after the RF pulse and ends before the data acquisition gradient pulse. MR data of an imaging object are acquired during application of the data acquisition gradient pulse, and a phase image is reconstructed based on the acquired MR data. The computer is also programmed to calculate a first contribution of phase to the phase image during the application of the RF pulse, to calculate a second contribution of phase to the phase image during the application of the data acquisition gradient pulse, and to generate a frequency map based on the phase image and based on the first and second contributions of phase.

In accordance with another aspect of the invention, a method of generating quantitative data from MR data acquired during a UTE sequence includes prescribing an ultrashort TE (UTE) sequence comprising an application of an RF pulse, an echo time (TE) period, and an application of a data acquisition gradient pulse, wherein the TE period begins after the RF pulse and ends before the data acquisition gradient pulse. The method also includes executing an MR scan comprising the UTE sequence, acquiring MR data of an imaging object during execution of the MR scan, and reconstructing a phase image based on the acquired MR data. The method further includes determining an RF phase contribution to the phase image during the application of the RF pulse, determining an acquisition phase contribution of phase to the phase image during the application of the data acquisition gradient pulse, and creating a frequency map based on the phase image, the RF phase contribution, and the acquisition phase contribution.

In accordance with yet another aspect of the invention, a non-transitory computer readable medium having stored thereon a computer program comprising instructions which when executed by a computer cause the computer to execute an MR scan comprising an ultrashort TE (UTE) sequence, acquire MR data of an imaging object during execution of the MR scan, and reconstruct a phase image based on the acquired MR data. The UTE sequence includes an application of an RF pulse, an echo time (TE) period, and an application of a data acquisition gradient pulse, wherein the TE period begins after the RF pulse and ends before the data acquisition gradient pulse. The instructions also cause the computer to determine an RF phase contribution to the phase image during the application of the RF pulse, to determine an acquisition phase contribution of phase to the phase image during the application of the data acquisition gradient pulse, and to create a frequency map based on the phase image, the RF phase contribution, and the acquisition phase contribution.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

Figure 2:
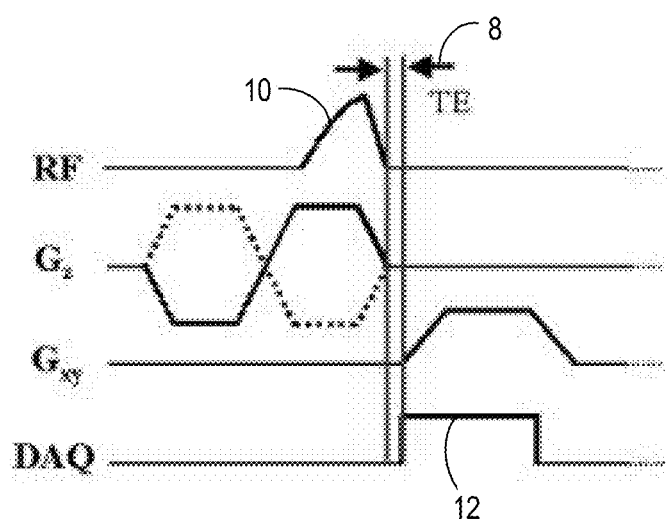
FIG. 2 is an exemplary pulse sequence diagram of a UTE pulse sequence.
Figure 3:
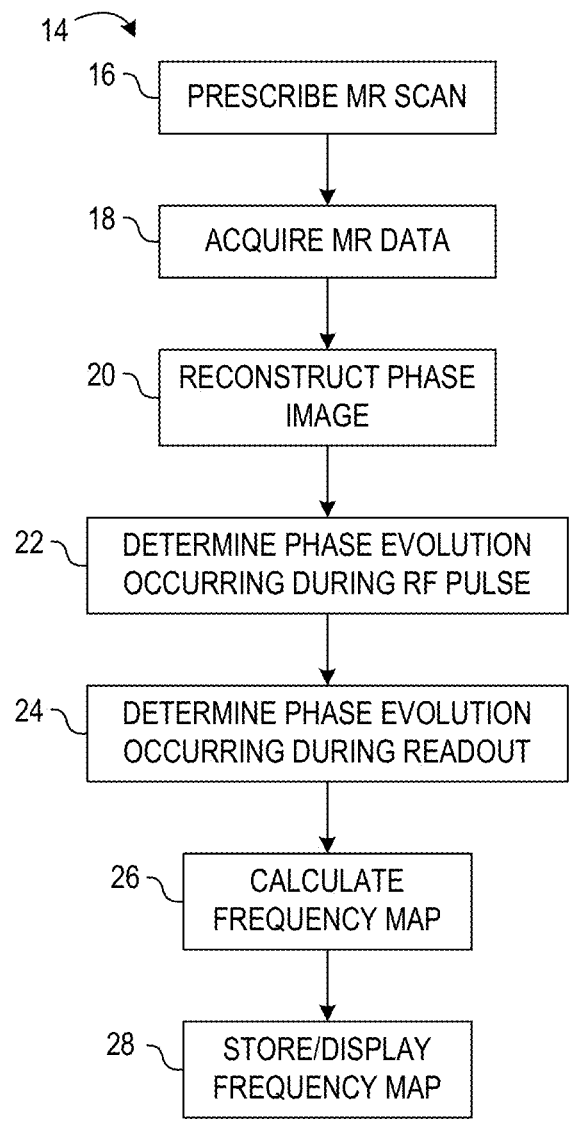
FIG. 3 is a flowchart of a technique for calculating a frequency map from a phase image reconstructed from MR data acquired during a UTE sequence according to an embodiment of the invention.

FIG. 3 shows a flowchart of a technique 14 for calculating a frequency map from a phase image reconstructed from MR data acquired during a UTE sequence according to an embodiment of the invention. Beginning at block 16, an MR scan is prescribed. According to embodiments of the invention, the MR scan includes a UTE sequence such as that illustrated in FIG. 2 where TE may be in the range from 0 ms to 10 ms or in a range from 0 ms to 2 ms, for example. In addition, the UTE sequence is preferably designed to acquire MR data according to a radial imaging technique where each line of MR data acquired contains data from a center of k-space. In one embodiment, the radial imaging technique may be a center-out radial acquisition technique as known in the art. However, other known radial acquisition techniques are also contemplated.

At block 18, the MR scan is executed, and MR data is acquired. The acquired MR data is reconstructed as known in the art to create a phase image ($\Phi$) at block 20 according to one embodiment of the invention.

Figure 1:
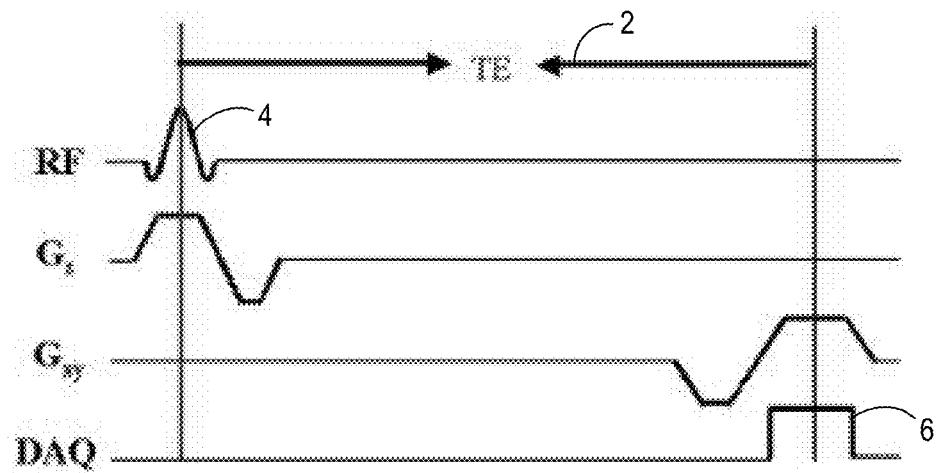
FIG. 1 is an exemplary pulse sequence diagram of a gradient recalled echo (GRE) pulse sequence.

The phase evolution for the TE period ($\Phi_{TE}$) during a typical GRE sequence (such as that shown in FIG. 1) of a spin with off-resonance frequency $\omega_{off}=2\pi f_{off}$ is given by:

$$\Phi_{TE}=\omega_{off}TE. \qquad \text{(Eqn. 1)}$$

In comparison, for a typical 2D UTE sequence such as that shown in FIG. 2 and/or prescribed in technique 14, the overall phase in the reconstructed phase image ($\Phi$) includes contributions to phase evolution due to phase accrual during the RF pulse ($\Phi_{RF}$), the TE period ($\Phi_{TE}$), and data acquisition ($\Phi_{DAQ}$) so that:

$$\Phi=\Phi_{RF}+\Phi_{TE}+\Phi_{DAQ}=\Phi_{RF}+\omega_{off}TE+\Phi_{DAQ}. \qquad \text{(Eqn. 2)}$$

By calculating the phase contributions due to $\Phi_{RF}$ and $\Phi_{DAQ}$ and by using the known values for the reconstructed phase image ($\Phi$) and TE, $\omega_{off}$ may be determined on a pixel-by-pixel basis for the entire image to calculate a relative frequency map for the reconstructed phase image ($\Phi$).

The phase contribution due to $\Phi_{RF}$ is determined at block 22. The phase evolution that occurs during the RF pulse of a UTE sequence may be determined using Bloch equation simulations. Just like T2 decay, phase evolution of the MR signal is purely determined by the transverse component of the magnetization vector. However, while T2 contrast in magnitude images is mixed with T1 contrast arising from the steady state longitudinal magnetization, phase contrast in UTE sequences is independent of the steady state magnetization (i.e., two tissue fibers with the same frequency but having different T1 components show identical phase evolution, albeit with different SNR). Therefore, the expressions for the phase evolution in UTE sequences are independent of the steady state longitudinal magnetization, and the thermal magnetization $M_0$ is used instead.

Still referring to block 22, in another embodiment of the invention in which the UTE sequence uses a non-selective hard RF pulse at an arbitrary flip angle and using the classical Bloch equations, one can derive an expression for the three spatial components of the magnetization, tipped into the transverse plane by a hard RF pulse of duration $\tau$ and amplitude $\omega_1=\gamma B_1$:

$$M_x(\tau) = M_0 \frac{\omega_{off}\omega_1}{\omega_2^2}[1-\cos(\omega_2\,\tau)] \qquad \text{(Eqn. 3)}$$

$$M_y(\tau) = M_0 \frac{\omega_1}{\omega_2}\sin(\omega_2\,\tau)$$

$$M_z(\tau) = M_0 \frac{1}{\omega_2^2}[\omega_1^2\cos(\omega_2\,\tau)+\omega_{off}^2]$$

where $\omega_2 = \sqrt{\omega_1^2+\omega_{off}^2}$.

The in-plane phase of the transverse magnetization can be calculated as follows:

$$\Phi(\tau) = \operatorname{atan}\!\left(\frac{M_x}{M_y}\right) = \operatorname{atan}\!\left(\frac{\omega_{off}[1-\cos(\omega_2\,\tau)]}{\omega_2\sin(\omega_2\,\tau)}\right). \qquad \text{(Eqn. 4)}$$

In another embodiment of the invention in which the UTE sequence uses a shaped RF pulse in the domain where the small tip angle approximation is valid, the solution for an arbitrary shaped pulse can readily be solved for the small tip angle approximation. The differential equation for the complex magnetization $M=M_x+iM_y$ during an arbitrary RF pulse $B_1(t)$ and slice selection gradient $G_s(t)$ in the small tip angle approximation is given by:

$$\frac{dM}{dt}+i\omega_z M = i\omega_1 M_0, \qquad \text{(Eqn. 5)}$$

where $\omega_z(t,z)=\gamma G_s(t)z-\omega_{off}$ and $\gamma$ is the gyromagnetic ratio. Eqn. 5 can be solved with an integration factor:

$$u(t)=\exp(i\!\int\!\omega_z ds). \qquad \text{(Eqn. 6)}$$

Using an RF pulse along the y-axis results in the solution:

$$M(\tau,z) = \gamma M_0\,\exp\!\left(-i\int_0^\tau \omega_z\,dt\right)\int_0^\tau B_1(t)\exp\!\left(i\int_0^t \omega_z\,dt'\right)dt. \qquad \text{(Eqn. 7)}$$

With 2D UTE sequences, slice-selective excitation is repeated twice (in separate TRs) with the slice selection gradient reversed ($G_s \rightarrow -G_s$), and the complex data obtained after the excitations are added to generate the final slice profile:

$$M(\tau,z) = \frac{\gamma M_0}{2}\Bigg(\exp\!\left(-i\int_o^\tau (\gamma G_s(t)z-\omega_{off})\,dt\right) \qquad \text{(Eqn. 8)}$$

$$\int_0^\tau B_1(t)\exp\!\left(i\int_o^t(\gamma G_s(t')z-\omega_{off})\,dt'\right)dt\Bigg) +$$

$$\frac{\gamma M_0}{2}\Bigg(\exp\!\left(-i\int_0^\tau(-\gamma G_s(t)z-\omega_{off})\,dt\right)$$

$$\int_0^\tau B_1(t)\exp\!\left(i\int_0^t(-\gamma G_s(t')z-\omega_{off})\,dt'\right)dt\Bigg).$$

The phase angle of the transverse magnetization at the center of the slice ($z=0$) reduces to:

$$\Phi(\tau) = \omega_{off} + \angle\!\left\{\int_0^\tau B_1(t)\exp(-i\omega_{off}t)\,dt\right\}, \qquad \text{(Eqn. 9)}$$

where the "$\angle$" operator takes the phase angle of the expression in the brackets. The phase of the entire magnetization averaged over the slice profile is given by:

$$\Phi(\tau) = \angle\!\left\{\int_z M(\tau,z)\,dz\right\}. \qquad \text{(Eqn. 10)}$$

Solving Eqn. 10 includes analytic equations for with $\omega_1(t)$ and $G_s(t)$, which with UTE sequences are VERSE corrected and, hence, not in simple closed form. Therefore, it is more straightforward to integrate Eqn. 10 numerically using the actual waveforms of with $\omega_1(t)$ and $G_s(t)$ that are used for imaging. Generally, a longer RF pulse allows for more phase evolution during the pulse (and, hence, higher phase contrast). In designing RF pulses for UTE imaging, however, a compromise is generally made to avoid excessive decay of the signal magnitude due to the short T2s encountered in MSK tissues.

Still referring to FIG. 3, technique 14 also includes determining the phase contribution due to $\Phi_{DAQ}$ at block 24. Calculations for the determination of the phase contribution is presented below beginning with the simplest case of 1D UTE imaging using an idealized flattop acquisition gradient followed by ramp sampling in 1D. Then, 1D ramp plus flattop sampling is presented followed by extensions into 2D and 3D UTE acquisitions.

1D Flattop Sampling:

For a constant read gradient G, acquisition k-space is traversed linearly in time t:

$$k(t) = \frac{\gamma}{2\pi} \int^t G dt' = \frac{\gamma}{2\pi} G t \rightarrow t = \frac{2\pi}{\gamma G} k. \quad \text{(Eqn. 11)}$$

The acquired UTE signal in k-space for a 1D flattop acquisition of an object with spin density m(x) and off-resonance $\omega_{off}$ is given by:

$$S(k) = \int_x m(x) e^{-i2\pi x k} e^{-i\frac{2\pi\omega_{off}}{\gamma G}k} dx \quad (k<0) \quad \text{(Eqn. 12)}$$

$$S(k) = \int_x m(x) e^{-i2\pi x k} e^{+i\frac{2\pi\omega_{off}}{\gamma G}k} dx \quad (k>0).$$

The solution of Eqn. 12 depends on the object m(x). In order to obtain an analytic solution of the final phase in the reconstructed image, an appropriate choice for m(x) is made. The general validity of the solution for arbitrary objects can be verified by simulations and experimental confirmation. Although a box function of length L (which is assumed greater than the voxel-size of the reconstructed image) may at first appear as the simplest form of m(x), it turns out that choosing a "sinc-like" spin density $$m(x) = Sinc\left(\frac{x}{L}\right)$$

at the origin (x=0) results in rectangular box function of the signal magnitude extending from $$-\frac{1}{2L} < k < \frac{1}{2L}$$

in k-space, and hence, a simpler solution for the final image phase $\Phi$. Using a sinc spin density function, Eqn. 12 becomes:

$$S(k) = e^{-i\frac{2\pi\omega_{off}}{\gamma G}k}\left(-\frac{1}{2L} < k < 0\right) \quad \text{(Eqn. 13)}$$

$$S(k) = e^{+i\frac{2\pi\omega_{off}}{\gamma G}k}\left(0 < k < \frac{1}{2L}\right),$$

while the signal for $$|k| > \frac{1}{2L}$$

is zero.

The reconstructed image is obtained by inverse Fourier transformation:

$$I(x) = \int_{-\infty}^{\infty} S(k) e^{i2\pi k x} dk \quad \text{(Eqn. 14)}$$

$$= \int_{-\frac{1}{2L}}^{0} e^{-i\frac{2\pi\omega_{off}}{\gamma G}k} e^{i2\pi k x} dk + \int_{0}^{\frac{1}{2L}} e^{+i\frac{2\pi\omega_{off}}{\gamma G}k} e^{i2\pi k x} dk.$$

While for this case (1D flattop), the complex signal and, hence, phase can be calculated for all values of x, the solution is rather complicated. As can be shown via experimental verifications, the phase throughout an object at a given off-resonance does not vary significantly (except in the vicinity of sharp edges, where radial imaging in the presence of off-resonance effects results in image artifacts even on the magnitude images). Therefore, the calculation can be further simplified by evaluating Eqn. 14 at the center of the object in the reconstructed image where x=0:

$$I(x=0) = \int_{-\frac{1}{2L}}^{0} e^{-i\frac{2\pi\omega_{off}}{\gamma G}k} dk + \int_{0}^{\frac{1}{2L}} e^{+i\frac{2\pi\omega_{off}}{\gamma G}k} dk \quad \text{(Eqn. 15)}$$

$$= 2\int_{0}^{\frac{1}{2L}} e^{+i\frac{2\pi\omega_{off}}{\gamma G}k} dk$$

$$I(x=0) = \frac{i\gamma G}{\pi\omega_{off}}\left(1 - e^{i\frac{\pi\omega_{off}}{\gamma G L}}\right).$$

The corresponding image phase is given by:

$$\Phi(x=0) = \angle\left[i\left(1 - e^{i\frac{\pi\omega_{off}}{\gamma G L}}\right)\right] \approx \frac{\pi\omega_{off}}{2\gamma G L}, \quad \text{(Eqn. 16)}$$

where the approximation was obtained by expanding the exponent.

1D Pure Ramp Sampling:

For a read gradient G that is ramped up from zero at a constant slew rate slew: G=slew·t. Hence, acquisition k-space is traversed at a rate proportional to the square of the time t so that:

$$k(t) = \frac{\gamma}{2\pi} \int^t G dt' = \frac{\gamma}{2\pi} \int^t slew \cdot t' \cdot dt' \quad \text{(Eqn. 17)}$$

$$= \frac{\gamma}{4\pi} slew \cdot t^2 \rightarrow t = 2\sqrt{\frac{\pi k}{\gamma \cdot slew}}.$$

The signal in k-space becomes:

$$S(k) = e^{-i2\omega_{off}\sqrt{\frac{\pi k}{\gamma \cdot slew}}}\left(-\frac{1}{2L} < k < 0\right) \quad \text{(Eqn. 18)}$$

$$S(k) = e^{+i2\omega_{off}\sqrt{\frac{\pi k}{\gamma \cdot slew}}}\left(0 < k < \frac{1}{2L}\right).$$

The reconstructed image at x=0 is obtained by inverse Fourier transformation:

$$I(x=0) = \int_{-\frac{1}{2L}}^{0} e^{-i2\omega_{off}\sqrt{\frac{\pi k}{\gamma \cdot slew}}} dk + \int_{0}^{\frac{1}{2L}} e^{+i2\omega_{off}\sqrt{\frac{\pi k}{\gamma \cdot slew}}} dk \quad \text{(Eqn. 19)}$$

$$= 2\int_{0}^{\frac{1}{2L}} e^{+i2\omega_{off}\sqrt{\frac{\pi k}{\gamma \cdot slew}}} dk$$

$$I(x=0) = \frac{\gamma L \cdot slew}{\pi \omega_{off}^2} \left[\left(1 - i2\omega_{off}\sqrt{\frac{\pi}{2\gamma L \cdot slew}}\right) e^{i2\omega_{off}\sqrt{\frac{\pi}{2\gamma L slew}}} - 1\right].$$

The image phase for pure ramp sampling is given by:

$$\Phi(x=0) \approx \frac{4}{3}\omega_{off}\sqrt{\frac{\pi}{2\gamma L \cdot slew}}. \quad \text{(Eqn. 20)}$$

1D Ramp Plus Flattop Sampling:
For the general, but also most relevant case of ramp sampling of duration $$T_{ramp} = \frac{G}{slew},$$

followed by flattop sampling, the integral in k-space is be split into two parts:

$$I(x=0) = \int_{-\frac{1}{2L}}^{-k_{ramp}} S(k)dk + \int_{-k_{ramp}}^{0} S(k)dk + \int_{0}^{k_{ramp}} S(k)dk + \int_{k_{ramp}}^{\frac{1}{2L}} S(k)dk \quad \text{(Eqn. 21)}$$

$$= 2\left(\int_{0}^{k_{ramp}} S(k)dk + \int_{k_{ramp}}^{\frac{1}{2L}} S(k)dk\right),$$

$$I(x=0) = 2\left(\int_{0}^{k_{ramp}} e^{i2\omega_{off}\sqrt{\frac{\pi k}{\gamma \cdot slew}}} dk + e^{i2\omega_{off}\sqrt{\frac{\pi k_{ramp}}{\gamma \cdot slew}}} \int_{k_{ramp}}^{\frac{1}{2L}} e^{+i\frac{2\pi\omega_{off}}{\gamma G}(k-k_{ramp})} dk\right),$$

and $$I(x=0) = \quad \text{(Eqn. 22)}$$

$$\frac{\gamma L \cdot slew}{\pi \omega_{off}^2}\left[\left(1 - i2\omega_{off}\sqrt{\frac{\pi}{2\gamma L \cdot slew}}\right) e^{i2\omega_{off}\sqrt{\frac{\pi}{2\gamma L slew}}} - 1\right]$$

$$\frac{1}{2L} < k_{ramp}$$

$$I(x=0) = \frac{\gamma L \cdot slew}{\pi \omega_{off}^2}\left[(1 - i\omega_{off}T_{ramp})e^{i\omega_{off}T_{ramp}} - 1\right] +$$

$$\frac{\gamma G L}{i\pi\omega_{off}} e^{i\frac{\omega_{off}T_{ramp}}{2}}\left(e^{i\frac{\pi\omega_{off}}{\gamma G}} - e^{\frac{i\omega_{off}T_{ramp}}{2}}\right)\frac{1}{2L} > k_{ramp},$$

where $k_{ramp} = \frac{\gamma}{4\pi} slew \cdot T_{ramp}^2$.

The image phase calculated from Eqn. 22 is given by:

$$\Phi(x=0) \approx \frac{4}{3}\omega_{off}\sqrt{\frac{\pi}{2\gamma L \cdot slew}} \frac{1}{2L} < k_{ramp} \quad \text{(Eqn. 23)}$$

$$\Phi(x=0) \approx \omega_{off}\left(\frac{\pi}{2\gamma G L} + \frac{G}{2 \cdot slew}\right)$$

$$= \omega_{off}\left(\frac{\pi}{2\gamma G L} + \frac{T_{ramp}}{2}\right)\frac{1}{2L} > k_{ramp},$$

where $k_{ramp} = \frac{\gamma}{4\pi} slew \cdot T_{ramp}^2$.

The two cases shown in Eqn. 23 depend on whether the maximum k-space extent of the signal $$\left(\frac{1}{2L}\right)$$

is reached during the ramp portion of the read gradient (top part) or after that, during the flattop portion (lower part). Note that Eqn. 23 covers both equations derived earlier: If $$\frac{1}{2L} < k_{ramp}$$

which is the ramp limited case, Eqn. 23 agrees with Eqn. 20 for pure ramp sampling. The case for pure flattop sampling (Eqn. 16) can be recovered by setting the ramp time to zero in the lower part of Eqn. 23.

2D Radial Sampling:
Our analysis in 1D can readily be extended to 2D. Whereas in 1D we assumed a rectangular box k-space signal with cutoff value at $$|k| > \frac{1}{2L},$$

the natural 2D extension assumes a disk with a radial cutoff value at $$k_r > \frac{1}{2L}.$$

The image from such a signal in k-space can be calculated by inverse 2D Fourier transformation over $k_x$ and $k_y$, or in polar coordinates $k_r$ and $k_\Phi$:

$$I(x, y) = \int_{-\infty}^{\infty}\int_{-\infty}^{\infty} S(k_x, k_y) e^{i2\pi(k_x x + k_y y)} dk_x dk \quad \text{(Eqn. 24)}$$

$$= \int_{0}^{2\pi}\int_{0}^{\infty} S(k_r, k_\Phi) e^{i2\pi k_r(x\cos k_\Phi + y\sin k_\Phi)} k_r dk_r dk_y.$$

As with the 1D calculations, this integral is most readily evaluated for a spin at the center of the object:

$$I(x=y=0) = \int_{-\infty}^{\infty}\int_{-\infty}^{\infty} S(k_x, k_y) dk_x dk_y dk_r \quad \text{(Eqn. 25)}$$

$$= \int_{0}^{2\pi}\int_{0}^{\infty} S(k_r, k_\Phi) k_r dk_r dk_\Phi$$

-continued $$= 2\pi \int_0^{\frac{1}{2L}} S(k_r) k_r,$$

where during the last step we invoked that our simple k-space signal is a symmetric disk and hence independent of $k_\Phi$. The integrant in Eqn. 25 differs from the 1D equivalent in Eqn. 15 only by a linear factor in $k_r$. The behavior of the signal during the 2D radial out k-space trajectory is given as before by:

$$S(k_r) = e^{i\frac{2\pi\omega_{off}}{\gamma G}k_r} \left(0 < k_r < \frac{1}{2L}\right) \text{ flattop} \quad \text{(Eqn. 26)}$$

$$S(k_r) = e^{i2\omega_{off}\sqrt{\frac{\pi k_r}{\gamma \cdot slew}}} \left(0 < k_r < \frac{1}{2L}\right) \text{ ramp}.$$

The general phase for ramp, followed by flattop sampling (i.e., the 2D equivalent to Eqn. 23) can be calculated from the solution of Eqn. 25 and is given by:

$$\Phi \approx \frac{8}{5}\omega_{off}\sqrt{\frac{\pi}{2\gamma L \cdot slew}} \frac{1}{2L} < k_{ramp} \quad \text{(Eqn. 27)}$$

$$\Phi \approx \omega_{off}\left(\frac{2\pi}{3\gamma GL} + \frac{G}{2 \cdot slew}\right)$$

$$= \omega_{off}\left(\frac{2\pi}{3\gamma GL} + \frac{T_{ramp}}{2}\right)\frac{1}{2L} > k_{ramp},$$

while the pure flattop phase can be calculated from Eqn. 27 by setting the ramp time to zero, as before.

3D Radial Sampling:

In 3D, a sphere in k-space with radial cutoff value at $$k_r > \frac{1}{2L}$$

is assumed. The image from such a signal in k-space can be calculated from a 3D Fourier transform over $k_x$, $k_x$ and $k_z$:

$$I(x, y, z) = \int_{-\infty}^{\infty}\int_{-\infty}^{\infty}\int_{-\infty}^{\infty} S(k_x k_y k_z) e^{i2\pi(k_x x + k_y y + k_z z)} dk_x dk_y dk_z. \quad \text{(Eqn. 28)}$$

This can be most readily solved in spherical coordinates at the origin:

$$I(x = y = z = 0) = \int_0^{2\pi}\int_0^{\pi}\int_0^{\infty} S(k_r k_\theta k_\Phi) k_r^2 \sin k_\theta dk_r dk_\theta dk_\Phi \quad \text{(Eqn. 29)}$$

$$= 4\pi \int_0^{\infty} S(k_r) k_r^2 dk_r,$$

where during the last step we evoked that our simple k-space signal is a symmetric sphere and hence independent of $k_\theta$ and $k_\Phi$. As one can observe, the integrant in Eqn. 29 differs from the 1D/2D equivalent in Eqn. 15/Eqn. 25 only by a factor of $k^2$. The behavior of the signal during the radial-out k-space trajectory is given again by Eqn. 26.

Solving Eqn. 29 (the general phase for 3D ramp) followed by flattop sampling is given by:

$$\Phi \approx \frac{12}{7}\omega_{off}\sqrt{\frac{\pi}{2\gamma L \cdot slew}} \frac{1}{2L} < k_{ramp} \quad \text{(Eqn. 30)}$$

$$\Phi \approx \omega_{off}\left(\frac{3\pi}{4\gamma GL} + \frac{G}{2 \cdot slew}\right)$$

$$= \omega_{off}\left(\frac{3\pi}{4\gamma GL} + \frac{T_{ramp}}{2}\right)\frac{1}{2L} > k_{ramp},$$

while the pure flattop phase can be calculated from Eqn. 30 by setting the ramp time to zero.

With the phase contributions due to $\Phi_{RF}$ and $\Phi_{DAQ}$ determined from blocks 22-24 and with the known TE and phase image data, technique 14 calculates a frequency map of $\omega_{off}$ on a pixel-by-pixel basis for the entire image based on Eqn. 2 at block 26. At block 28, technique 14 stores the frequency map to an image storage database or displays the frequency map to a user or operator.

While that described above is primarily directed toward off-resonance during UTE excitation and acquisition, embodiments of the invention also include an extension of the derived equations to $T_2$ relaxation and the corresponding reduction in image intensity. Both off-resonance and the $T_2$ relaxation rate ($R_2=1/T_2$) enter the signal equation as a linear multiplier of the spin evolution time t: $S(t) \sim e^{i\omega t}e^{-R_2 t}$. This correspondence enables the equations to be recast for the complex magnetization in Eqn. 8, Eqn. 13, Eqn. 26, etc. to account for signal loss due to $T_2$ decay by making the substitution $\omega_{off} \rightarrow iR_2$ from which it follows that $e^{i\omega_{off} t} \rightarrow e^{-R_2 t}$.

The most general case can be treated by letting $\omega_{off} \rightarrow \omega_{off} + iR_2 \Rightarrow e^{i\omega_{off} t} \rightarrow e^{i\omega_{off} t}e^{-R_2 t}$. Off-resonance does not significantly affect the magnitude of the image intensity (unless significant off-resonance frequencies are present and the image is acquired using a low BW, at which point severe image artifacts are likely to occur). Similarly, $T_2$ relaxation does not have a significant effect on the final phase of the image (unless very rapidly relaxing tissues are images using a low BW, at which point image SNR is likely to be compromised). Therefore, off-resonance phase and signal magnitude loss can be treated individually.

Figure 4:
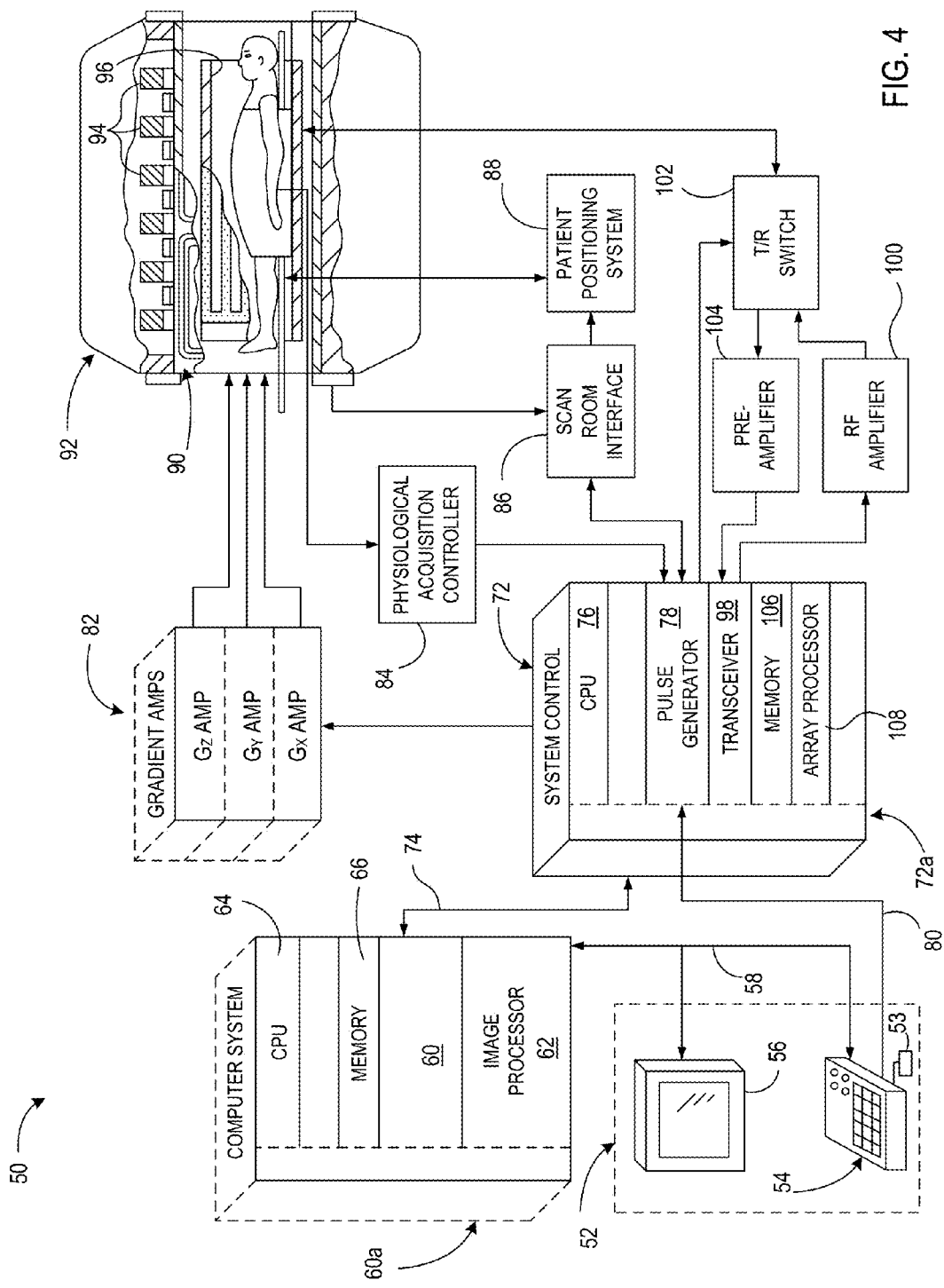
FIG. 4 is a schematic block diagram of an exemplary MR imaging system for use with an embodiment of the invention.

Referring to FIG. 4, the major components of a magnetic resonance imaging (MRI) system 50 incorporating an embodiment of the invention are shown. The operation of the system is controlled for certain functions from an operator console 52 which in this example includes a keyboard or other input device 53, a control panel 54, and a display screen 56. The console 52 communicates through a link 58 with a separate computer system 60 that enables an operator to control the production and display of images on the display screen 56. The computer system 60 includes a number of modules which communicate with each other through a backplane 60a. These modules include an image processor module 62, a CPU module 64 and a memory module 66, known in the art as a frame buffer for storing image data arrays. The computer system 60 communicates with a separate system control 72 through a high speed serial link 74. The input device 53 can include a mouse, joystick, keyboard, track ball, touch activated screen, light wand, voice control, card reader, push-button, or any similar or equivalent input device, and may be used for interactive geometry prescription.

The system control 72 includes a set of modules connected together by a backplane 72a. These include a CPU module 76 and a pulse generator module 78 which connects to the operator console 52 through a serial link 80. It is through link 80 that the system control 72 receives commands from the operator to indicate the scan sequence that is to be performed. The pulse generator module 78 operates the system components to carry out the desired scan sequence and produces data which indicates the timing, strength and shape of the RF pulses produced, and the timing and length of the data acquisition window. The pulse generator module 78 connects to a set of gradient amplifiers 82, to indicate the timing and shape of the gradient pulses that are produced during the scan. The pulse generator module 78 can also receive patient data from a physiological acquisition controller 84 that receives signals from a number of different sensors connected to the patient, such as ECG signals from electrodes attached to the patient. And finally, the pulse generator module 78 connects to a scan room interface circuit 86 which receives signals from various sensors associated with the condition of the patient and the magnet system. It is also through the scan room interface circuit 86 that a patient positioning system 88 receives commands to move the patient to the desired position for the scan.

The gradient waveforms produced by the pulse generator module 78 are applied to the gradient amplifier system 82 having Gx, Gy, and Gz amplifiers. Each gradient amplifier excites a corresponding physical gradient coil in a gradient coil assembly generally designated 90 to produce the magnetic field gradients used for spatially encoding acquired signals. The gradient coil assembly 90 forms part of a resonance assembly 92 which includes a polarizing magnet 94 and a whole-body RF coil 96. A transceiver module 98 in the system control 72 produces pulses which are amplified by an RF amplifier 100 and coupled to the RF coil 96 by a transmit/receive switch 102. The resulting signals emitted by the excited nuclei in the patient may be sensed by the same RF coil 96 and coupled through the transmit/receive switch 102 to a preamplifier 104. The amplified MR signals are demodulated, filtered, and digitized in the receiver section of the transceiver 98. The transmit/receive switch 102 is controlled by a signal from the pulse generator module 78 to electrically connect the RF amplifier 100 to the coil 96 during the transmit mode and to connect the preamplifier 104 to the coil 96 during the receive mode. The transmit/receive switch 102 can also enable a separate RF coil (for example, a surface coil) to be used in either the transmit or receive mode.

The MR signals picked up by the RF coil 96 are digitized by the transceiver module 98 and transferred to a memory module 106 in the system control 72. A scan is complete when an array of raw k-space data has been acquired in the memory module 106. This raw k-space data is rearranged into separate k-space data arrays for each image to be reconstructed, and each of these is input to an array processor 108 which operates to Fourier transform the data into an array of image data. This image data is conveyed through the serial link 74 to the computer system 60 where it is stored in memory. In response to commands received from the operator console 52 or as otherwise directed by the system software, this image data may be archived in long term storage or it may be further processed by the image processor 62 and conveyed to the operator console 52 and presented on the display 56.

One skilled in the art will appreciate that embodiments of the invention may be interfaced to and controlled by a computer readable storage medium having stored thereon a computer program and coupled to, for example, computer system 60. The computer readable storage medium includes a plurality of components such as one or more of electronic components, hardware components, and/or computer software components. These components may include one or more computer readable storage media that generally stores instructions such as software, firmware and/or assembly language for performing one or more portions of one or more implementations or embodiments of a sequence. These computer readable storage media are generally non-transitory and/or tangible. Examples of such a computer readable storage medium include a recordable data storage medium of a computer and/or storage device. The computer readable storage media may employ, for example, one or more of a magnetic, electrical, optical, biological, and/or atomic data storage medium. Further, such media may take the form of, for example, floppy disks, magnetic tapes, CD-ROMs, DVD-ROMs, hard disk drives, and/or electronic memory. Other forms of non-transitory and/or tangible computer readable storage media not list may be employed with embodiments of the invention.

A number of such components can be combined or divided in an implementation of a system. Further, such components may include a set and/or series of computer instructions written in or implemented with any of a number of programming languages, as will be appreciated by those skilled in the art. In addition, other forms of computer readable media such as a carrier wave may be employed to embody a computer data signal representing a sequence of instructions that when executed by one or more computers causes the one or more computers to perform one or more portions of one or more implementations or embodiments of a sequence.

A technical contribution for the disclosed method and apparatus is that it provides for a computer implemented method of calculating a phase image frequency map based on image data acquired during execution of a UTE MR scan.

In accordance with one embodiment of the invention, an MR imaging apparatus includes apparatus includes a magnetic resonance imaging (MRI) system having a plurality of gradient coils positioned about a bore of a magnet, and an RF transceiver system and an RF switch controlled by a pulse module to transmit RF signals to an RF coil assembly to acquire MR images. The MRI apparatus also includes a computer programmed to execute an MR scan comprising an application of an RF pulse, an echo time (TE) period, and an application of a data acquisition gradient pulse, wherein the TE period begins after the RF pulse and ends before the data acquisition gradient pulse. MR data of an imaging object are acquired during application of the data acquisition gradient pulse, and a phase image is reconstructed based on the acquired MR data. The computer is also programmed to calculate a first contribution of phase to the phase image during the application of the RF pulse, to calculate a second contribution of phase to the phase image during the application of the data acquisition gradient pulse, and to generate a frequency map based on the phase image and based on the first and second contributions of phase.

In accordance with another embodiment of the invention, a method of generating quantitative data from MR data acquired during a UTE sequence includes prescribing an ultrashort TE (UTE) sequence comprising an application of an RF pulse, an echo time (TE) period, and an application of a data acquisition gradient pulse, wherein the TE period begins after the RF pulse and ends before the data acquisition gradient pulse. The method also includes executing an MR scan comprising the UTE sequence, acquiring MR data of an imaging object during execution of the MR scan, and reconstructing a phase image based on the acquired MR data. The method further includes determining an RF phase contribution to the phase image during the application of the RF pulse, determining an acquisition phase contribution of phase to the phase image during the application of the data acquisition gradient pulse, and creating a frequency map based on the phase image, the RF phase contribution, and the acquisition phase contribution.

In accordance with yet another embodiment of the invention, a non-transitory computer readable medium having stored thereon a computer program comprising instructions which when executed by a computer cause the computer to execute an MR scan comprising an ultrashort TE (UTE) sequence, acquire MR data of an imaging object during execution of the MR scan, and reconstruct a phase image based on the acquired MR data. The UTE sequence includes an application of an RF pulse, an echo time (TE) period, and an application of a data acquisition gradient pulse, wherein the TE period begins after the RF pulse and ends before the data acquisition gradient pulse. The instructions also cause the computer to determine an RF phase contribution to the phase image during the application of the RF pulse, to determine an acquisition phase contribution of phase to the phase image during the application of the data acquisition gradient pulse, and to create a frequency map based on the phase image, the RF phase contribution, and the acquisition phase contribution.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An MRI apparatus comprising:
   a magnetic resonance imaging (MRI) system having a plurality of gradient coils positioned about a bore of a magnet, and an RF transceiver system and an RF switch controlled by a pulse module to transmit RF signals to an RF coil assembly to acquire MR images; and
   a computer programmed to:
      execute an MR scan comprising an application of an RF pulse, an echo time (TE) period, and an application of a data acquisition gradient pulse, wherein the TE period begins after the RF pulse and ends before the data acquisition gradient pulse;
      acquire MR data of an imaging object during application of the data acquisition gradient pulse;
      reconstruct a phase image based on the acquired MR data;
      calculate a first contribution of phase to the phase image during the application of the RF pulse;
      calculate a second contribution of phase to the phase image during the application of the data acquisition gradient pulse;
      generate a frequency map based on the phase image and based on the first and second contributions of phase.

2. The MRI apparatus of claim 1 wherein the computer, in being programmed to execute the MR scan, is programmed to execute a center-out radial acquisition MR scan.

3. The MRI apparatus of claim 1 wherein the computer, in being programmed to generate the frequency map, is programmed to generate the frequency map according to the equation:

$$\Phi = \Phi_{RF} + \omega_{off} TE + \Phi_{DAQ},$$

where $\Phi$ represents the phase image, $\Phi_{RF}$ represents the first contribution of phase to the phase image during the application of the RF pulse, $\Phi_{DAQ}$ represents the second contribution of phase to the phase image during the application of the data acquisition gradient pulse, and $\omega_{off}$ represents an off-resonance frequency.

4. The MRI apparatus of claim 1 wherein the computer, in being programmed to calculate the first contribution, is programmed to calculate the first contribution based on the equation:

$$\Phi(\tau) = \mathrm{atan}\left(\frac{M_x}{M_y}\right) = \mathrm{atan}\left(\frac{\omega_{off}[1 - \cos(\omega_2 \tau)]}{\omega_2 \sin(\omega_2 \tau)}\right),$$

where $\omega_{off}$ is an off-resonance frequency, $\tau$ is a duration of the RF pulse, $\omega_1 = \gamma B_1$ is an amplitude of the RF pulse, and $M_x$ and $M_y$ are spatial components of a thermal magnetization according to:

$$M_x(\tau) = M_0 \frac{\omega_{off} \omega_1}{\omega_2^2}[1 - \cos(\omega_2 \tau)]$$

$$M_y(\tau) = M_0 \frac{\omega_1}{\omega_2} \sin(\omega_2 \tau),$$

where
$\omega_2 = \sqrt{\omega_1^2 + \omega_{off}^2}$, and $M_0$ is the thermal magnetization.

5. The MRI apparatus of claim 1 wherein the computer, in being programmed to calculate the first contribution, is programmed to calculate the first contribution based on the equation:

$$\Phi(\tau) = \omega_{off}\tau + \angle\left\{\int_0^\tau B_1(t)\exp(-i\omega_{off} t)\,dt\right\},$$

where $\omega_{off}$ is an off-resonance frequency, $\tau$ is a duration of the RF pulse, and the "$\angle$" operator takes the phase angle of the expression in the brackets.

6. The MRI apparatus of claim 1 wherein the computer, in being programmed to calculate the second contribution, is programmed to calculate the second contribution based on the equation:

$$\Phi(x=0) = \angle\left[i\left(1 - e^{i\frac{\pi\omega_{off}}{\gamma GL}}\right)\right] \approx \frac{\pi\omega_{off}}{2\gamma GL},$$

where $\omega_{off}$ is an off-resonance frequency, G is a gradient pulse, L is a length of a box function, $\gamma$ is the gyromagnetic ratio, and the "$\angle$" operator takes the phase angle of the expression in the brackets.

7. The MRI apparatus of claim 1 wherein the computer, in being programmed to calculate the second contribution, is programmed to calculate the second contribution based on the equation:

$$\Phi(x=0) \approx \frac{4}{3}\omega_{off}\sqrt{\frac{\pi}{2\gamma L \cdot \mathrm{slew}}},$$

where $\omega_{off}$ is an off-resonance frequency, L is a length of a box function, $\gamma$ is the gyromagnetic ratio, and slew is a gradient pulse slew rate.

8. The MRI apparatus of claim 1 wherein the computer, in being programmed to calculate the second contribution, is programmed to calculate the second contribution based on the equation:

$$\Phi(x=0) \approx \frac{4}{3}\omega_{off}\sqrt{\frac{\pi}{2\gamma L \cdot \text{slew}}} \qquad \frac{1}{2L} < k_{ramp}$$

$$\Phi(x=0) \approx \omega_{off}\left(\frac{\pi}{2\gamma GL} + \frac{G}{2 \cdot \text{slew}}\right) = \omega_{off}\left(\frac{\pi}{2\gamma GL} + \frac{T_{ramp}}{2}\right) \quad \frac{1}{2L} > k_{ramp}$$

where $\omega_{off}$ is an off-resonance frequency, G is a gradient pulse, slew is a slew rate of the gradient pulse, L is a length of a box function, $\gamma$ is the gyromagnetic ratio, $T_{ramp}$ is a duration of a ramp sampling determined according to:

$$T_{ramp} = \frac{G}{\text{slew}}.$$

$k_{ramp}$ is a magnitude of a k-space ramp signal determined according to:

$$k_{ramp} = \frac{\gamma}{4\pi}\text{slew} \cdot T_{ramp}^2.$$

9. The MRI apparatus of claim 1 wherein the computer, in being programmed to calculate the second contribution, is programmed to calculate the second contribution based on the equation:

$$\Phi \approx \frac{8}{5}\omega_{off}\sqrt{\frac{\pi}{2\gamma L \cdot \text{slew}}} \qquad \frac{1}{2L} < k_{ramp}$$

$$\Phi \approx \omega_{off}\left(\frac{2\pi}{3\gamma GL} + \frac{G}{2 \cdot \text{slew}}\right) = \omega_{off}\left(\frac{2\pi}{3\gamma GL} + \frac{T_{ramp}}{2}\right) \quad \frac{1}{2L} > k_{ramp}$$

where $\omega_{off}$ is an off-resonance frequency, G is a gradient pulse, slew is a slew rate of the gradient pulse, L is a length of a box function, $\gamma$ is the gyromagnetic ratio, $T_{ramp}$ is a duration of a ramp sampling determined according to:

$$T_{ramp} = \frac{G}{\text{slew}}, \text{ and}$$

$k_{ramp}$ is a magnitude of a k-space ramp signal determined according to:

$$k_{ramp} = \frac{\gamma}{4\pi}\text{slew} \cdot T_{ramp}^2.$$

10. The MRI apparatus of claim 1 wherein the computer, in being programmed to calculate the second contribution, is programmed to calculate the second contribution based on the equation:

$$\Phi \approx \frac{12}{7}\omega_{off}\sqrt{\frac{\pi}{2\gamma L \cdot \text{slew}}} \qquad \frac{1}{2L} < k_{ramp}$$

$$\Phi \approx \omega_{off}\left(\frac{3\pi}{4\gamma GL} + \frac{G}{2 \cdot \text{slew}}\right) = \omega_{off}\left(\frac{3\pi}{4\gamma GL} + \frac{T_{ramp}}{2}\right) \quad \frac{1}{2L} > k_{ramp}$$

where $\omega_{off}$ is an off-resonance frequency, G is a gradient pulse, slew is a slew rate of the gradient pulse, L is a length of a box function, $\gamma$ is the gyromagnetic ratio, $T_{ramp}$ is a duration of a ramp sampling determined according to:

$$T_{ramp} = \frac{G}{\text{slew}}, \text{ and}$$

$k_{ramp}$ is a magnitude of a k-space ramp signal determined according to:

$$k_{ramp} = \frac{\gamma}{4\pi}\text{slew} \cdot T_{ramp}^2.$$

11. A method of generating quantitative data from MR data acquired during a UTE sequence, the method comprising:
prescribing an ultrashort TE (UTE) sequence comprising an application of an RF pulse, an echo time (TE) period, and an application of a data acquisition gradient pulse, wherein the TE period begins after the RF pulse and ends before the data acquisition gradient pulse;
executing an MR scan comprising the UTE sequence;
acquiring MR data of an imaging object during execution of the MR scan;
reconstructing a phase image based on the acquired MR data;
determining an RF phase contribution to the phase image during the application of the RF pulse;
determining an acquisition phase contribution of phase to the phase image during the application of the data acquisition gradient pulse;
creating a frequency map based on the phase image, the RF phase contribution, and the acquisition phase contribution.

12. The method of claim 11 further comprising displaying the frequency map to a user.

13. The method of claim 11 wherein executing the MR scan comprises executing a radial acquisition MR scan.

14. The method of claim 11 wherein executing the radial MR scan comprises executing a center-out radial acquisition MR scan.

15. The method of claim 11 wherein prescribing the UTE sequence comprises setting the TE period equal to a value in the range of 0 ms to 2 ms.

16. The method of claim 11 wherein creating the frequency map comprises creating the frequency map according to the equation:

$$\Phi = \Phi_{RF} + \omega_{off} \cdot TE + \Phi_{DAQ},$$

where $\Phi$ represents the phase image, $\Phi_{RF}$ represents the first contribution of phase to the phase image during the application of the RF pulse, $\Phi_{DAQ}$ represents the second contribution of phase to the phase image during the application of the data acquisition gradient pulse, and $\omega_{off}$ represents an off-resonance frequency.

17. A non-transitory computer readable medium having stored thereon a computer program comprising instructions which when executed by a computer cause the computer to:
  execute an MR scan comprising an ultrashort TE (UTE) sequence comprising:
    an application of an RF pulse;
    an echo time (TE) period; and
    an application of a data acquisition gradient pulse, wherein the TE period begins after the RF pulse and ends before the data acquisition gradient pulse;
  acquire MR data of an imaging object during execution of the MR scan;
  reconstruct a phase image based on the acquired MR data;
  determine an RF phase contribution to the phase image during the application of the RF pulse;
  determine an acquisition phase contribution of phase to the phase image during the application of the data acquisition gradient pulse;
  create a frequency map based on the phase image, the RF phase contribution, and the acquisition phase contribution.

18. The non-transitory computer readable medium of claim 17 wherein the instructions that cause the computer to create the frequency map cause the computer to create a relative frequency map.

19. The non-transitory computer readable medium of claim 17 wherein the instructions that cause the computer to create the relative frequency map cause the computer to create a relative frequency map according to the equation:

$$\Phi = \Phi_{RF} + \omega_{off} \cdot TE + \Phi_{DAQ},$$

where $\Phi$ represents the phase image, $\Phi_{off}$ represents the first contribution of phase to the phase image during the application of the RF pulse, $\Phi_{DAQ}$ represents the second contribution of phase to the phase image during the application of the data acquisition gradient pulse, and $\omega_{off}$ represents an off-resonance frequency.

20. The non-transitory computer readable medium of claim 17 wherein the instructions that cause the computer to determine the acquisition phase contribution of phase cause the computer to determine the acquisition phase contribution of phase based on one of a first equation, a second equation, a third equation, a fourth equation, and a fifth equation;
  wherein the first equation comprises:

$$\Phi(x=0) = L\left[i\left(1 - e^{i\frac{\pi \omega_{off}}{\gamma GL}}\right)\right] \approx \frac{\pi \omega_{off}}{2\gamma GL};$$

wherein the second equation comprises:

$$\Phi(x=0) \approx \frac{4}{3}\omega_{off}\sqrt{\frac{\pi}{2\gamma L \cdot \text{slew}}}$$

wherein the third equation comprises:

$$\Phi(x=0) \approx \frac{4}{3}\omega_{off}\sqrt{\frac{\pi}{2\gamma L \cdot \text{slew}}} \qquad \frac{1}{2L} < k_{ramp}$$

$$\Phi(x=0) \approx \omega_{off}\left(\frac{\pi}{2\gamma GL} + \frac{G}{2 \cdot \text{slew}}\right) = \omega_{off}\left(\frac{\pi}{2\gamma GL} + \frac{T_{ramp}}{2}\right) \qquad \frac{1}{2L} > k_{ramp}$$

wherein the fourth equation comprises:

$$\Phi \approx \frac{8}{5}\omega_{off}\sqrt{\frac{\pi}{2\gamma L \cdot \text{slew}}} \qquad \frac{1}{2L} < k_{ramp}$$

$$\Phi \approx \omega_{off}\left(\frac{2\pi}{3\gamma GL} + \frac{G}{2 \cdot \text{slew}}\right) = \omega_{off}\left(\frac{2\pi}{3\gamma GL} + \frac{T_{ramp}}{2}\right) \qquad \frac{1}{2L} > k_{ramp};$$

wherein the fifth equation comprises:

$$\Phi \approx \frac{12}{7}\omega_{off}\sqrt{\frac{\pi}{2\gamma L \cdot \text{slew}}} \qquad \frac{1}{2L} < k_{ramp}$$

$$\Phi \approx \omega_{off}\left(\frac{3\pi}{4\gamma GL} + \frac{G}{2 \cdot \text{slew}}\right) = \omega_{off}\left(\frac{3\pi}{4\gamma GL} + \frac{T_{ramp}}{2}\right) \qquad \frac{1}{2L} > k_{ramp}$$

; and where $\omega_{off}$ is an off-resonance frequency, G is a gradient pulse, slew is a slew rate of the gradient pulse, L is a length of a box function, $\gamma$ is the gyromagnetic ratio, $T_{ramp}$ is a duration of a ramp sampling determined according to:

$$T_{ramp} = \frac{G}{\text{slew}}, \text{ and}$$

$k_{ramp}$ is a magnitude of a k-space ramp signal determined according to:

$$k_{ramp} = \frac{\gamma}{4\pi}\text{slew} \cdot T_{ramp}^2.$$

* * * * *

UNITED STATES PATENT AND TRADEMARK OFFICE
CERTIFICATE OF CORRECTION

PATENT NO. : 8,854,039 B2  
APPLICATION NO. : 13/091710  
DATED : October 7, 2014  
INVENTOR(S) : Michael Carl Page 1 of 1

It is certified that error appears in the above-identified patent and that said Letters Patent is hereby corrected as shown below:

In the Claims,

Col. 15, line 24 (Claim 8), delete "$T_{ramp} = \dfrac{G}{slew},$" and substitute therefore -- $T_{ramp} = \dfrac{G}{slew},$ and --.

Col. 17, line 34 (Claim 19), delete "$\Phi_{off}$" and substitute therefore -- $\Phi_{RF}$ --.

Signed and Sealed this  
Thirty-first Day of March, 2015

Michelle K. Lee  
*Director of the United States Patent and Trademark Office*